US012565420B2

(12) United States Patent
Conway et al.

(10) Patent No.: US 12,565,420 B2
(45) Date of Patent: Mar. 3, 2026

(54) MEMS PACKAGING WITH ACTUATOR STATOR PROVIDING ELECTRICAL CONNECTION POINT

(71) Applicant: Connaught Electronics Ltd., Tuam (IE)

(72) Inventors: Gerard Conway, Tuam (IE); Enda Ward, Tuam (IE); Terrance McDonald, Troy, MI (US); Maurice Dore, Tuam (IE)

(73) Assignee: Connaught Electronics Ltd. (IE)

( * ) Notice: Subject to any disclaimer, the term of this patent is extended or adjusted under 35 U.S.C. 154(b) by 217 days.

(21) Appl. No.: 18/210,679

(22) Filed: Jun. 16, 2023

(65) Prior Publication Data

US 2024/0417241 A1    Dec. 19, 2024

(51) Int. Cl.
*B81B 7/00* (2006.01)

(52) U.S. Cl.
CPC .......... B81B 7/007 (2013.01); *B81B 2207/07* (2013.01); *B81B 2207/096* (2013.01)

(58) Field of Classification Search
CPC ............................ B81B 7/007; B81B 2207/07
See application file for complete search history.

(56) References Cited

U.S. PATENT DOCUMENTS

| | | | |
|---|---|---|---|
| 6,528,875 B1 | 3/2003 | Glenn et al. | |
| 8,988,586 B2 | 3/2015 | McKinley | |
| 9,306,475 B1 | 4/2016 | Ba-Tis et al. | |
| 10,807,857 B2 | 10/2020 | Liu et al. | |
| 10,893,200 B2 | 1/2021 | Ba-Tis et al. | |
| 10,965,848 B1 | 3/2021 | Ba-Tis | |
| 12,145,839 B1 * | 11/2024 | Ba-Tis | B81B 7/0058 |
| 2016/0245667 A1 | 8/2016 | Najafi et al. | |
| 2018/0086628 A1 * | 3/2018 | Vossough | G01L 19/0007 |

(Continued)

FOREIGN PATENT DOCUMENTS

| | | |
|---|---|---|
| CN | 209250741 U | 8/2019 |
| CN | 215512709 U | 1/2022 |
| WO | 2021249191 A1 | 12/2021 |

OTHER PUBLICATIONS

International Search Report and Written Opinion for PCT/US2024/033361, Completed on Sep. 5, 2024, All togehter 11 Pages.

*Primary Examiner* — Moazzam Hossain
(74) *Attorney, Agent, or Firm* — Dickinson Wright PLLC

(57) ABSTRACT

A MEMS device is provided with an actuator stator providing an electrical connection point. The MEMS device includes an electrical distribution substrate, and an actuator stator positioned above it. The actuator stator has a floor and an outer frame extending up from the floor. The MEMS device includes a stator pad disposed on the outer frame and above the electrical distribution substrate. The MEMS device also includes an actuator rotor suspended above the floor, within the outer frame, with a sensor mounted thereon. A wire bond interconnect electrically couples the sensor to the stator pad. In some embodiments, the outer frame includes a via extending therethrough which electrically connects the stator pad with the electrical distribution substrate, enabling an electrical connection between the sensor and the electrical distribution substrate. In some embodiments, a second wire bond interconnect electrically connects the stator pad and the substrate.

18 Claims, 2 Drawing Sheets

(56)     References Cited

U.S. PATENT DOCUMENTS

| | | | |
|---|---|---|---|
| 2018/0213312 A1 | 7/2018 | Hsuai et al. | |
| 2019/0241426 A1* | 8/2019 | Sun ......................... | H01L 24/16 |
| 2020/0385264 A1 | 12/2020 | Brockmeier et al. | |
| 2021/0354979 A1* | 11/2021 | Ba-Tis ................. | H04N 23/687 |
| 2022/0030148 A1 | 1/2022 | Gruhlke et al. | |
| 2023/0031882 A1 | 2/2023 | Yoshimura et al. | |

* cited by examiner

MEMS PACKAGING WITH ACTUATOR STATOR PROVIDING ELECTRICAL CONNECTION POINT

TECHNICAL FIELD

The present disclosure relates to a microelectromechanical system (MEMS) device and associated MEMS packaging in which the static structure of a MEMS actuator (e.g., stator) provides an electrical connection point for a sensor.

BACKGROUND

MEMS devices are generally known as microscopic devices incorporating both electronic and moving parts. They typically include one or more components (e.g., sensor) that interact with the surrounding environment. Various environmental factors such as temperature changes and vibrations can impact the performance of the sensor.

SUMMARY

According to one embodiment, a MEMS device comprises an electrical distribution substrate, and an actuator stator positioned above the electrical distribution substrate, the actuator stator having a floor and an outer frame extending up from the floor. The MEMS device further comprises a stator pad disposed on the outer frame and above the electrical distribution substrate, and an actuator rotor suspended above the floor of the actuator stator and within the outer frame. The MEMS device further comprises a sensor disposed on the actuator rotor, and a wire bond interconnect electrically coupling the sensor and the stator pad. The outer frame includes a via extending therethrough which electrically connects the stator pad with the electrical distribution substrate, enabling an electrical connection between the sensor and the electrical distribution substrate In an embodiment, a MEMS device comprise an area array substrate; an actuator stator positioned above the area array substrate, the actuator stator having a floor and an outer frame extending up from the floor; a stator pad disposed on the outer frame and above the area array substrate; an actuator rotor suspended above the floor of the actuator stator and within the outer frame; a sensor disposed on the actuator rotor; a first wire bond interconnect disposed on, and electrically connecting, the sensor and the stator pad; and a second wire bond interconnect disposed on, and electrically connecting, the stator pad and the area array substrate to enable an electrical connection between the sensor and the area array substrate.

In an embodiment, a MEMS devices comprises an electrical distribution substrate; an actuator stator positioned above the electrical distribution substrate and having a floor; an actuator rotor suspended above the floor of the actuator stator, wherein the actuator rotor is configured to move in a vertical direction relative to the actuator stator; a stator pad disposed on the actuator stator and electrically insulated from the actuator stator; a sensor mounted to the actuator rotor; and at least one wire bond interconnect configured to electrically couple the sensor to the electrical distribution substrate by way of the stator pad.

DETAILED DESCRIPTION

Figure 1:
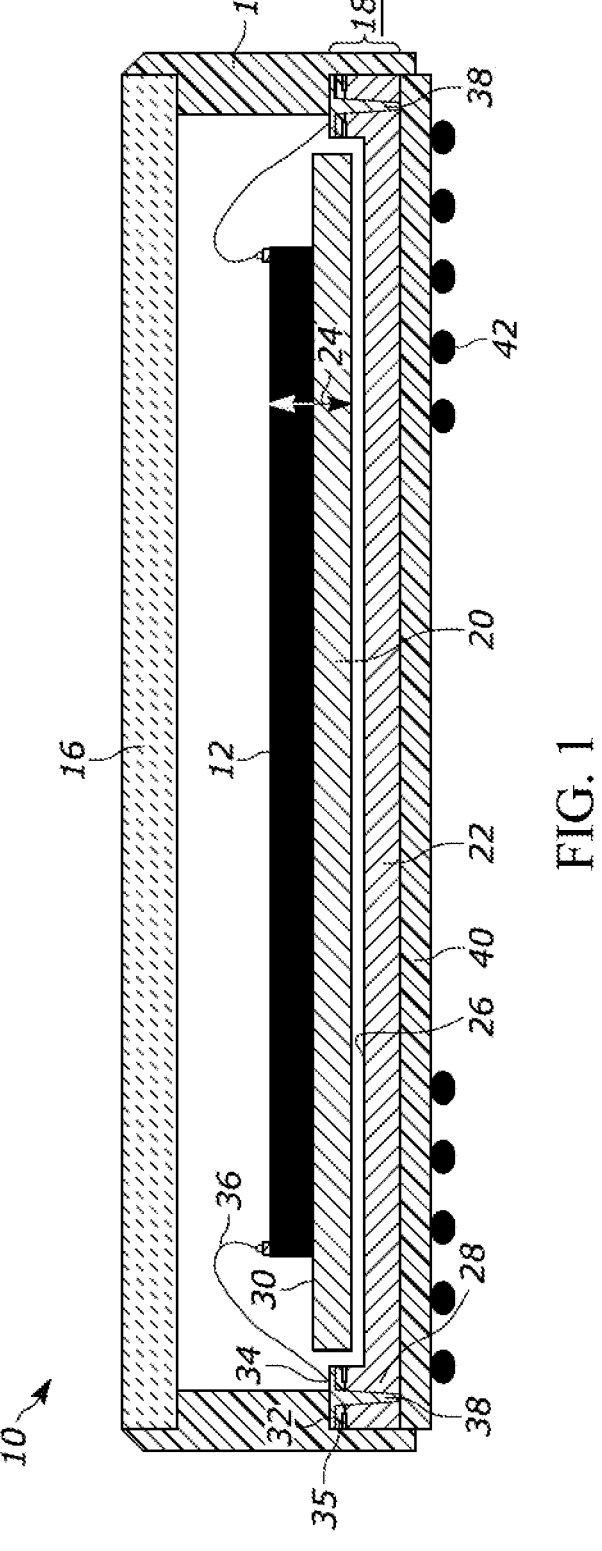
FIG. 1 is a cross-sectional view of a MEMS device and an associated MEMS package according to one embodiment of the present disclosure.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

"A", "an", and "the" as used herein refers to both singular and plural referents unless the context clearly dictates otherwise. By way of example, "a stator" refers to one stator or more than one stator.

MEMS devices are generally known to incorporate both electronic and moving parts. They typically include one or more components (e.g., sensor) that interact with the surrounding environment. Various environmental factors such as temperature changes and vibration can impact the performance of the sensor.

Certain prior art systems include a MEMS device with an image sensor (e.g., camera) mounted on a MEMS actuator that can move the image sensor focal plane along the optical axis in order to adjust the focal position. The image sensor is located either below or above the circuit board, and is wire bonded to the circuit board. However, in systems such as this, relatively long wire-bonds can be susceptible to movement and shorting when the MEMS device is utilized in environments with harsh movements, such as automobiles. Moreover, especially in the case where the image sensor is located below the circuit board, this approach consumes both top and bottom circuit-board area. The wirebond profile is higher than typical solutions to relieve stress on the bond, but can increase the risk of bond-to-bond shorting during operation and manufacturing. This makes miniaturization difficult.

Therefore, according to various embodiments disclosed herein, a MEMS device is packaged in such a way that takes advantage of the stator for electrical connection with the circuit board (or other electrical distribution layer or substrate). In embodiments, an actuator has a rotor and a stator and is provided in the MEMS device to move a MEMS-mounted sensor; the MEMS-mounted sensor is mounted on the rotor and is electrically connected to the stator by way of wire bond interconnects. This allows for greater miniaturization of the MEMS device and its packaging, while enabling free movement of the sensor and actuator.

FIG. 1 illustrates a cross-sectional view of a MEMS device 10 according to one embodiment of the present disclosure. References to the MEMS "device" are intended to refer to a packaged device containing a MEMS-mounted sensor (also referred to herein more generally as a sensor), the circuitry to which it electrically communicates to, and the package itself. As such, the MEMS device 10 can also be referred to as a MEMS system, or microsystem.

The MEMS device 10 includes a sensor 12 housed within a package 14, also referred to as a MEMS package or encapsulation. The sensor 12 may be a single sensor or a sensor array. The sensor 12 may be an image sensor such as a camera, lidar sensor, radar sensor, or the like and may include an array (e.g., a one- or two-dimensional array) of sensor cells (or pixels) for sensing optical signals. For example, the sensor 12 can include a photosensor, such as a photodiode that can generate an electrical voltage or current signal corresponding to the intensity of the optical signal illuminating the pixel. For example, each pixel may convert the optical signal incident on the pixel to an electrical current or integrate the current using a capacitor to generate a voltage signal. The current or voltage signal may be converted to digital pixel data by an analog-to-digital converter. Therefore, each pixel may generate digital pixel data representing an intensity of light received by the pixel. The pixel data from the pixels in sensor array may represent an image of an object or a scene. In particular embodiments, the sensor 12 includes a Charged Coupled Device (CCD) image sensor that include arrays of photosensors and metal-oxide-semiconductor (MOS) capacitors, or a Complementary Metal-Oxide Semiconductor (CMOS) or Active-Pixel Sensor (APS) image sensor that includes arrays of photodiodes and MOS field-effect transistor (MOSFET) amplifiers.

While the sensor 12 is described above as being an image sensor, the present disclosure is not limited to such an embodiment. For example, the sensor may be or include a temperature sensor, pressure sensor, gyroscope, accelerometer, or other such sensor typically found in MEMS devices. Unless otherwise stated, the sensor of the present disclosure is not limited to a particular type of sensor.

The MEMS device 10 may also include a processor (e.g., microprocessor) bonded to or integrated into the sensor 12, configured to at least partially process the data received from the sensor 12 (e.g., pixel data in the embodiment described above). In other embodiments, the processing of the sensor data takes place outside of the package 14.

The package 14 at least partially encapsulates the sensor 12. The package 14 may be made of a polymer material or another dielectric material to provide physical protection and insulation to the sensor 12. The package 14 may include a cover 16 made of glass or other optically-transparent material that protects the sensor 12 from above. In some implementations, for example when the sensor is an image sensor, the sensor may further include one or more optical filters (e.g., a Bayer filter array, not shown) to filter or modify the light (e.g., the intensity, phase, wavelength, or polarization of the light) received by each element (also referred to as a pixel or a cell) of the sensor. In some embodiments, the cover 16 may be one of the one or more optical filters. In embodiments in which the sensor 12 is an image sensor, the cover 16 can include or integrate a lens, wherein the image sensor is configured to detect light that is collected and focused by the lens.

The MEMS device 10 also includes a MEMS actuator 18, which includes a rotor 20 (also referred to as a MEMS rotor, MEMS actuator rotor, or actuator rotor), and a stator 22 (also referred to as a MEMS stator, MEMS actuator stator, or actuator stator). The rotor 20 is a moving part of the actuator 18, and the stator 22 is a stationary part of the actuator 18. The MEMS actuator 18 also includes mechanical springs (not shown in this view) that connect the rotor 20 to the stator 22, suspending the rotor 20. In embodiments, the sensor 12 is attached to the rotor 20 using die bond techniques via a glue or an adhesive. The MEMS actuator 18 and attached sensor 12 can move relative to the stator. In embodiments, when a voltage is applied across the rotor 20 and the stator 22, an electrostatic force develops between adjacent piston and tube electrodes in the vertical direction. This electrostatic force moves the rotor 20 from its static position towards the stator 22 in a pure translation (piston-style, such as disclosed in U.S. Pat. No. 9,306,475 which is incorporated by reference herein in its entirety) motion along the vertical axis (e.g., up and down in the orientation shown in FIG. 1, as indicated by arrow 24). When the voltage drops, the rotor 20 moves back to its equilibrium position due to the restoring force in the supporting springs that connect the rotor 20 to the stator 22. In the event the sensor 12 is an image sensor, this movement allows focus adjustments in order to compensate for the thermal effects on the focus of the lens of the image sensor, for example.

In one embodiment, the rotor 20 is partially surrounded by the stator 22. For example, as shown in FIG. 1, the stator 22 includes a floor 26 and an outer frame 28 (or posts or extensions) extending upward from the floor 26. The rotor 20 is located within the outer frame 28, with an upper surface 30 of the rotor 20 being vertically beneath an upper surface 32 of the outer frame 28. This helps reduce the overall vertical footprint of the MEMS device 10 while still providing an adequate structure for electrical connection by way of the stator 22, as described further below.

A series of wire bond pads 34 are fabricated on the top surface of the frame 28 of the stator 22. A dielectric insulation layer 35 can be provided between the wire bond pads 34 and the metallization layer (or top surface) of the stator 22. The sensor 12 is wire bonded to the wire bond pads 34 via wire bond interconnects 36. The frame 28 of the stator 22 is provided with a Through Silicon Via (TSV) 38 that electrically connects the wire bond pads 34 to an underlying electrical distribution substrate 40, such as a silicon substrate or electrical connection layer on silicon. In one embodiment, the electrical distribution substrate 40 is a Redistribution Layer (RDL) attached to a silicon substrate or integrated circuit via solder balls 42. RDL is a conductive (e.g., metal) layer such as metal interconnects that redistribute the Input/Output (I/O) access to different parts of the substrate. This allows for better electrical access to the pads where necessary. In another embodiment, the electrical distribution layer is an area array substrate such as a Ball Grid Array (BGA) substrate, having solder balls 42 on the bottom surface thereof to make connections to the circuit board. Because various substrates exist for chip boards and the like, this component can more generally be referred to as a substrate. In yet other embodiments, the electrical distribution layer is a Land Grid Array (LGA).

The TSVs 38 allow for a connection from the sensor 12 to the electrical distribution substrate 40 through the stator 22. The wire bond interconnects 36 electrically connect the sensor 12 to the wire bond pads 34 above the frame 28 of the stator 22, and the TSVs 38 in turn provide electrical connection from these wire bond pads 34 to the electrical distribution substrate 40. The MEMS actuator 18 and sensor 12 can then be encapsulated into package 14 using the MEMS actuator 18 (or its stator 22) as a base for the RDL. This packaging provides electrical connection from the sensor 12 to the electrical distribution substrate 40 by way of the MEMS stator 22. This enables a compact packaging of the MEMS device 10 with a reduced vertical footprint.

The package 14, electrical distribution substrate 40, and cover 16 (if provided) are sized to enable significant vertical movement of the rotor 20 and sensor 12. For example, an air gap above the sensor 12 and below the cover 16 can exist, wherein the size of this gap exceeds the combined thickness of the sensor 12 and rotor 20. In an embodiment, the size of the gap is approximately double the combined thickness of the sensor 12 and rotor 20. The interior of the package 14 can be filled with gas (e.g., inert gas, air, $N_2$, etc.). In another embodiment, the interior of the package is filled with liquid that matches the refractive index of the cover 16 to increase thermal conductivity and shock absorption.

Figure 2:
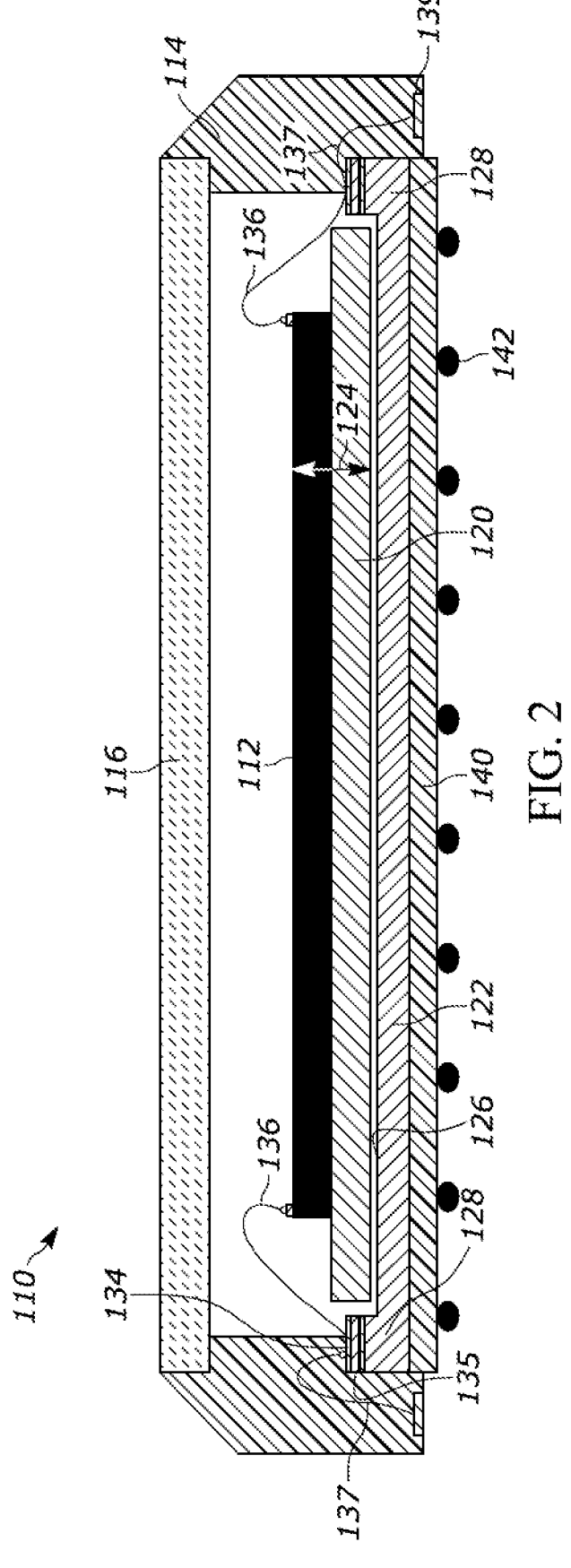
FIG. 2 is a cross-sectional view of a MEMS device and an associated MEMS package according to one embodiment of the present disclosure.

FIG. 2 illustrates a cross-sectional view of a MEMS device 110 according to another embodiment of the present disclosure. The MEMS device 110 of FIG. 2 has similar structure as described above with reference to FIG. 1, and the corresponding reference numbers of these similar or identical parts is increased by 100. In the interest of brevity, embodiments of the structural details described above with reference to FIG. 1 apply equally to the embodiment shown in FIG. 2 unless otherwise stated.

Similar to FIG. 1, the MEMS device 110 has a sensor 112 is at least partially contained within a package 114 that may include a transparent (e.g., glass) cover 116 positioned above the sensor 112. The sensor 112 is able to move in the vertical direction as indicated by arrow 124 by way of MEMS actuator 118. The MEMS actuator 118 includes a rotor 120 and a stator 122. Once again, the MEMS stator 122 may have a floor 126 and an outer frame 128 extending upward from the floor 126. This packaging design enables the rotor 120 to be at least partially enclosed within the outer confines of the stator 122, e.g. vertically below an upper surface of the outer frame 128 of the stator 122.

In this embodiment, the stator 122 has pads that can accommodate a dual wire bond, one from the sensor 112 and one to an electrical distribution substrate 140 such as an area array substrate like a BGA substrate. In particular, a first wire bond interconnect 136 electrically couples the sensor 112 to a wire bond pad 134, and a second wire bond interconnect 137 electrically couples the wire bond pad 134 to the electrical distribution substrate 140 (e.g., via pad 139). While only one wire bond pad 134 is shown on the stator 122, of course multiple pads can be utilized. A dielectric insulation layer 135 can be provided between the wire bond pads 134 and the metallization layer (or top surface) of the stator 122. Due to the dual wire bond, the stator 122 need not include a TSV such as the TSV 38 shown in FIG. 1. Rather, the dielectric insulation layer 135 can electrically insulate the wire bond pads 134 from the remainder of the outer frame 128 of the stator 122.

As can be the case in the embodiment of FIG. 1, the electrical distribution substrate 140 (e.g., BGA substrate) along with the MEMS actuator stator 122 can be encapsulated using an encapsulant material (e.g., package 114) that will seal the MEMS device 110 when a glass cover 116 is mounted thereto, but will still have an open cavity above the sensor 112 to allow for free vertical movement of the MEMS actuator rotor 120.

The final encapsulated package can be soldered onto a standard PCB using reflow techniques, for example. Solder balls 142 are shown as an example.

While exemplary embodiments are described above, it is not intended that these embodiments describe all possible forms encompassed by the claims. The words used in the specification are words of description rather than limitation, and it is understood that various changes can be made without departing from the spirit and scope of the disclosure.

As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A MEMS device comprising:

an electrical distribution substrate;

an actuator stator positioned above the electrical distribution substrate, the actuator stator having a floor and an outer frame extending up from the floor, wherein the outer frame has an upper surface;

a stator pad disposed on the outer frame and above the electrical distribution substrate;

an actuator rotor suspended above the floor of the actuator stator and within the outer frame, the actuator rotor having an upper surface that is offset from the upper surface of the outer frame;

a sensor disposed on the actuator rotor; and a wire bond interconnect electrically coupling the sensor and the stator pad;

wherein the outer frame includes a via extending therethrough which electrically connects the stator pad with the electrical distribution substrate, enabling an electrical connection between the sensor and the electrical distribution substrate.

2. The MEMS device of claim 1, wherein the electrical distribution substrate is a Redistribution Layer (RDL).

3. The MEMS device of claim 1, wherein the stator pad is disposed on an upper surface of the outer frame of the actuator stator.

4. The MEMS device of claim 1, further comprising a dielectric insulation layer electrically insulating the stator pad from a metallization layer of the actuator stator.

5. The MEMS device of claim 1, wherein the via is a Through Silicon Via (TSV).

6. The MEMS device of claim 1, further comprising a package at least partially encapsulating the actuator rotor and the sensor, wherein the package is sized and configured to enable vertical movement of the actuator rotor and the sensor within the package.

7. The MEMS device of claim 6, wherein the actuator rotor and the actuator stator are configured such that when a voltage is applied across the actuator rotor and the actuator stator, an electrostatic force develops to move the actuator rotor from a first vertical position to a second vertical position relative to the actuator stator.

8. The MEMS device of claim 6, wherein an air gap exists within the package above the sensor, wherein the air gap has a thickness that exceeds a combined thickness of the sensor and the actuator rotor.

9. The MEMS device of claim 8, further comprising a cover that cooperates with the package to encapsulate the actuator rotor and the sensor, wherein the air gap exists between the sensor and the cover.

10. The MEMS device of claim 1, wherein the upper surface of the actuator rotor is vertically beneath the upper surface of the outer frame.

11. A MEMS device comprising:

an electrical distribution substrate;

an actuator stator positioned above the electrical distribution substrate and having a floor;

an actuator rotor suspended above the floor of the actuator stator, wherein the actuator rotor is configured to move in a vertical direction relative to the actuator stator;

a stator pad disposed on the actuator stator and electrically insulated from the actuator stator;

a sensor mounted to the actuator rotor;

at least one wire bond interconnect configured to electrically couple the sensor to the electrical distribution substrate by way of the stator pad;

a package sized and configured to enable vertical movement of the actuator rotor within the package; and a cover that, in cooperation with the package, encapsulates the actuator stator and the actuator rotor, wherein an air gap exists between the sensor and the cover, wherein the air gap has a thickness that exceeds a combined thickness of the sensor and the actuator rotor.

12. The MEMS device of claim 11, wherein the actuator stator includes a frame extending in the vertical direction from the floor, wherein the stator pad is disposed on the frame.

13. The MEMS device of claim 12, wherein the frame includes a via extending therethrough which electrically connects the stator pad with the electrical distribution substrate, enabling an electrical connection between the sensor and the electrical distribution substrate by way of the stator pad.

14. The MEMS device of claim 11, wherein the electrical distribution substrate is a Redistribution Layer (RDL).

15. The MEMS device of claim 11, wherein the at least one wire bond interconnect includes:

a first wire bond interconnect electrically connecting the sensor and the stator pad; and a second wire bond interconnect electrically connecting the stator pad and the electrical distribution substrate.

16. The MEMS device of claim 11, further comprising a dielectric insulation layer electrically insulating the stator pad from a metallization layer of the actuator stator.

17. The MEMS device of claim 12, wherein the frame has an upper surface and the actuator rotor has an upper surface that is not aligned with the upper surface of the frame.

18. The MEMS device of claim 17, wherein the upper surface of the actuator rotor is vertically beneath the upper surface of the frame.

* * * * *